(12) United States Patent
Xiong et al.

(10) Patent No.: US 7,932,004 B1
(45) Date of Patent: Apr. 26, 2011

(54) FEATURE IDENTIFICATION FOR METROLOGICAL ANALYSIS

(75) Inventors: Yalin Xiong, Union City, CA (US); Carl E. Hess, Los Altos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 110 days.

(21) Appl. No.: 12/566,151

(22) Filed: Sep. 24, 2009

Related U.S. Application Data

(60) Provisional application No. 61/102,270, filed on Oct. 2, 2008.

(51) Int. Cl.
*G03F 9/00* (2006.01)
*G06K 9/00* (2006.01)
(52) U.S. Cl. ............................ 430/30; 382/145; 382/149
(58) Field of Classification Search .................... 430/30; 382/145, 149
See application file for complete search history.

(56) References Cited

U.S. PATENT DOCUMENTS

| | | | | |
|---|---|---|---|---|
| 6,094,256 | A * | 7/2000 | Grodnensky et al. | 355/77 |
| 7,642,019 | B2 * | 1/2010 | Kim | 430/30 |
| 2008/0131796 | A1 * | 6/2008 | Werner et al. | 430/30 |

* cited by examiner

*Primary Examiner* — Christopher G Young
(74) *Attorney, Agent, or Firm* — Luedeka, Neely & Graham, P.C.

(57) ABSTRACT

A method for selecting a set of features for monitoring a lithography process using a reticle, by identifying a set of candidate features, defining control regions around the candidate features, performing substrate level analysis using the reticle with different settings for the lithography process, determining which of the candidate features are most changed by the different settings, ranking the candidate features according to how much they are changed, and selecting the test set of features from those candidate features that are most changed.

9 Claims, 1 Drawing Sheet

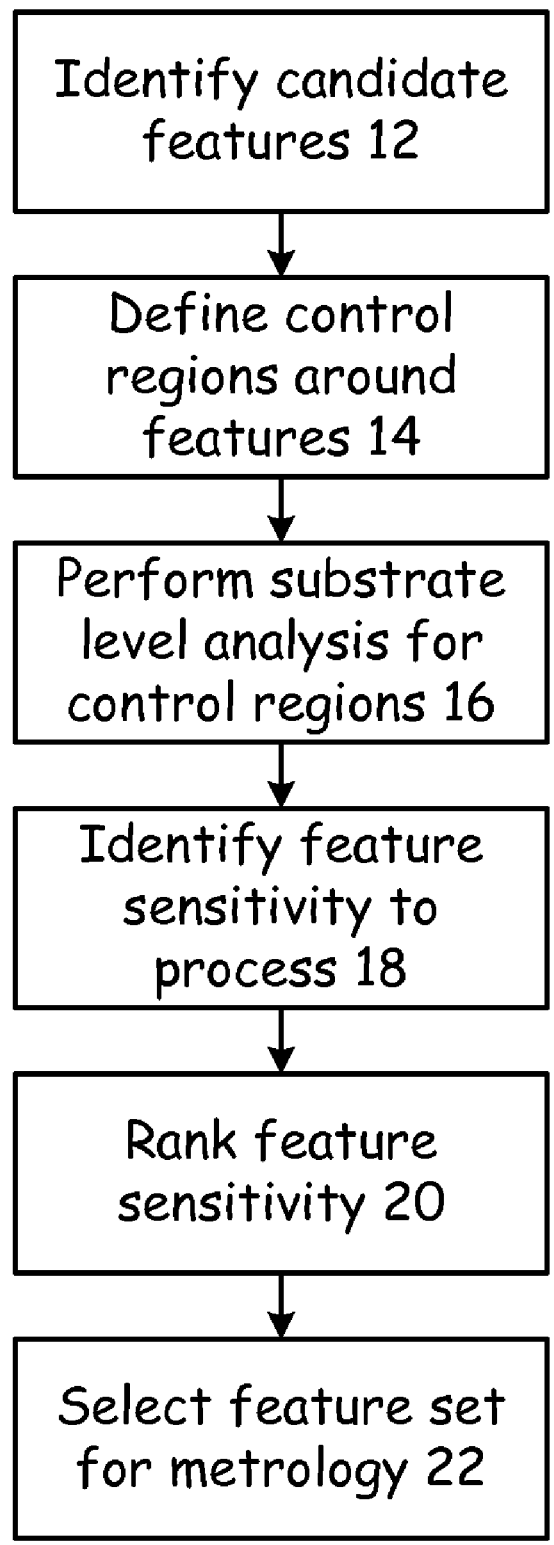

FEATURE IDENTIFICATION FOR METROLOGICAL ANALYSIS

FIELD

This application claims all rights to and priority on U.S. provisional application Ser. No. 61/102,270 filed 2008 Oct. 2. This invention relates to the field of integrated circuits. More particularly, this invention relates to selecting appropriate sites on integrated circuits for metrological process evaluation.

BACKGROUND

The fabrication of integrated circuits relies heavily on lithographic processes. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

Lithography for current node sizes (45 nanometers and below) is particularly challenging. The integrated circuit designs at this size exhibit high reticle error enhancement factors, and can print reliably only over relatively narrow focus-exposure process windows. To ensure that the fabrication process is under control, a given number of the most challenging features within the design are selected for a detailed metrology analysis. These features are carefully measured, such as with a scanning electron microscope, and the results are analyzed to ensure that the substrates have been printed correctly. It is important to choose the most error-sensitive (fragile) features in the design, because this metrology analysis is used as an early detection system for any problems in the lithography process.

One problem is that modern integrated circuits have so many fragile features in their design that it is difficult to choose those that are the most valuable for the metrology analysis. Optical proximity compensation verification is currently used to determine the features on which to perform the metrology analysis. This is a method by which the design of the reticle, including the optical proximity compensation decorations, is input into a lithographic simulation to determine which features are particularly fragile. Those fragile features are then identified as candidates for the substrate metrology analysis.

The optical proximity compensation verification process tends to generate an extreme number of potential features, while providing relatively little information as to how to determine which of those potential features are the most valuable. To overcome this problem, more features than are really needed are selected for analysis, to try to get a reasonable statistical probability of selecting at least one of the more fragile features. This is time consuming and expensive. However, the most fragile features would not otherwise be selected out of the many thousands of identified features, so the earliest warning of process deviations would not otherwise be achieved using this method.

What is needed, therefore, is a method that overcomes problems such as those described above, at least in part.

SUMMARY

The above and other needs are met by a method for selecting a set of features for monitoring a lithography process using a reticle, by identifying a set of candidate features, defining control regions around the candidate features, performing substrate level analysis using the reticle with different settings for the lithography process, determining which of the candidate features are most changed by the different settings, ranking the candidate features according to how much they are changed, and selecting the test set of features from those candidate features that are most changed.

Thus, the present methods provide the ability to properly prioritize the features that are the most valuable for metrology analysis, using both reticle design data and information from the actual reticle itself, and thereby provide the most accurate and earliest warning of substrate lithography process deviations. These methods reduce the number of features that are selected for analysis, by recommending only the most fragile features, instead of merely relying on (what is hoped to be) a statistically significant sampling of potential features. This in turn lowers the time and cost of the metrology analysis, because fewer features are inspected. In addition, a better early warning system of potential lithography problems is provided, because the most fragile features are actually selected for inspection.

In various embodiments according to this aspect of the invention, the step of identifying the set of candidate features is performed using optical proximity compensation verification for design data for the reticle. Alternately, the step of identifying the set of candidate features is performed by an inspection of the reticle. In some embodiments the different settings comprise a matrix of focus and exposure settings. In some embodiments the step of performing substrate level analysis is accomplished by exposing test substrates with the reticle, and in other embodiments the step of performing substrate level analysis is accomplished using a processor and inspection data from the reticle. In some embodiments the step of determining which candidate features are most changed includes determining which candidate features are changed by the smallest changes in the settings for the lithography process. Some embodiments include the step of monitoring the lithography process by performing metrology analysis on the test set of features on production substrates that are exposed with the reticle.

According to another aspect of the invention there is described a method for monitoring a lithography process, by exposing a set of test substrates with a reticle using different settings for the lithography process, inspecting the exposed test substrates to detect which features are most changed by the different settings, selecting a test set of features from those features that are most changed, and monitoring the lithography process by performing metrology analysis on the test set of features on production substrates that are exposed with the reticle.

BRIEF DESCRIPTION OF THE DRAWING

Further advantages of the invention are apparent by reference to the detailed description when considered in conjunction with the FIGURE, which depicts a flow chart of a method according to an embodiment of the present invention.

DETAILED DESCRIPTION

The inventors have determined that the prior art methods do not take into consideration the construction of the actual, physical reticle that is used for printing the substrates (using the design information from the reticle only), and thus do not recommend the best features for analysis. Methods according to various embodiments of the present invention select those features on the substrate that are the most valuable for metrology analysis based on both the design information for the reticle and the details of the actual reticle that is used in the printing of that substrate. Identifying substrate metrology analysis positions by using reticle construction errors in addition to the reticle design data has not been previously known.

In other words, a given feature in an integrated circuit design might not look fragile, but might be fragile as actually printed on the substrate, because of differences between the design of the reticle and the actual physical condition of the reticle. These differences might be brought about such as by reticle fabrication defects or other issues. The most fragile features, and thus the most valuable features for metrology analysis, are those features that are affected the most by the smallest variances in the lithography process.

With reference now to the FIGURE, the first step of the method 10, according to one embodiment of the invention, is to identify the potential features for analysis, as given in block 12. This can be done either in a separate step such as with an optical proximity compensation verification tool, or it can be accomplished during an inspection of the actual reticle. In either case, this step is performed by simulating the lithography operation across the focus-exposure process window (or across the critical dimension window) for the fully optical proximity compensation decorated reticle or design. The features that fail at focus and exposure values closest to the nominal values are designated as potential features for analysis. This step in one embodiment is performed on a reticle inspection tool, which is a specialized processor-based tool capable of imaging a reticle and processing the image and other data.

The second step of the method 10 is to generally locate control regions that surround the locations of these identified features, as given in block 14. The third step is a full focus-exposure process window inspection at the substrate plane for the control regions, as given in block 16. Those features that are not properly formed are identified as being sensitive to the process within the process window, as given in block 18. The sensitivity of these features is ranked according to how slight a variation from the nominal settings of the lithography process is required to produce the defect in the feature, as given in block 20. Position information for some number of the features in the prioritized list is output, and a desired number of the most sensitive (most fragile) features are selected as the metrology analysis set, as given in block 22.

In this manner, the total number of substrate metrology features is reduced from the prior art, because there is better knowledge about the sensitivity of each feature. The methods generally require an additional amount of work up-front, but this is more than compensated for because it is only required once for each reticle-process combination, and greatly reduces the amount of work that needs to be repetitively performed later on during metrology analysis.

According to another embodiment of the invention, the first step of identifying a universe of potential features as described above is not performed. Instead, the substrate plane inspection is performed first, across either the focus-exposure process window or across the critical dimension window, and for the entire reticle. In one embodiment, rather than tracking all of the fragile features that are found, the feature identification process keeps track of a running list of only a given number of the most fragile features as the process progresses. In this manner, the identification process is performed at a very high level of sensitivity without producing a list with an overwhelming number of fragile features.

EXAMPLE 1

(A) Identify an initial list of features using optical proximity compensation verification.

(B) Define control regions around the features in the initial list.
(C) Perform a substrate plane inspection analysis in the control regions on the substrate using the actual reticle. The substrate plane inspection analysis includes:
  (i) Reticle pattern recovery using the transmitted and reflected light images acquired from the inspection station,
  (ii) A computational lithography translation of the recovered reticle pattern down to the aerial image plane in resist, and
  (iii) A resist/etch model to determine the actual impact on the substrate.
  This inspection can be performed across the full focus-exposure process window to ensure that the full impact of any reticle defect is incorporated.
(D) The affects on the substrate of the features identified are prioritized, and those with greater impact are used for metrology analysis to monitor the lithography process. The prioritization process could use process window width and location, maximum critical dimension impact, specific reticle error enhancement factors, or other factors.

Thus, the present methods provide the ability to properly prioritize the features that are the most valuable for metrology analysis, and thereby provide the earliest warning of substrate fabrication process deviations. These methods reduce the number of features that are selected for analysis, by recommending only the most fragile features, instead of merely relying on (what is hoped to be) a statistically significant sampling of potential features. This in turn lowers the time and cost of the metrology analysis, because fewer features are inspected. In addition, a better early warning system of potential lithography problems is provided, because the most fragile features are actually selected for inspection.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:
1. A method for monitoring a lithography process, the method comprising the steps of:
  exposing a set of test substrates with a reticle using different settings for the lithography process,
  inspecting the exposed test substrates to detect which features are most changed by the different settings,
  selecting a test set of features from those features that are most changed, and
  monitoring the lithography process by performing metrology analysis on the test set of features on production substrates that are exposed with the reticle.
2. A method for selecting a set of features for monitoring a lithography process using a reticle, the method comprising the steps of:
  identifying a set of candidate features,
  defining control regions around the candidate features, performing substrate level analysis using the reticle with different settings for the lithography process, determining which of the candidate features are most changed by the different settings, ranking the candidate features according to how much they are changed, and selecting the test set of features from those candidate features that are most changed.

3. The method of claim 2, wherein the step of identifying the set of candidate features is performed using optical proximity compensation verification for design data for the reticle.

4. The method of claim 2, wherein the step of identifying the set of candidate features is performed by an inspection of the reticle.

5. The method of claim 2, wherein the different settings comprise a matrix of focus and exposure settings.

6. The method of claim 2, wherein the step of performing substrate level analysis is accomplished by exposing test substrates with the reticle.

7. The method of claim 2, wherein the step of performing substrate level analysis is accomplished using a processor and inspection data from the reticle.

8. The method of claim 2, wherein the step of determining which candidate features are most changed comprises determining which candidate features are changed by the smallest changes in the settings for the lithography process.

9. The method of claim 2, further comprising the step of monitoring the lithography process by performing metrology analysis on the test set of features on production substrates that are exposed with the reticle.

* * * * *